United States Patent [19]

von Seggern et al.

[11] Patent Number: 4,512,941

[45] Date of Patent: Apr. 23, 1985

[54] POLARIZING OF PIEZOELECTRIC MATERIAL

[75] Inventors: Heinz von Seggern, Westfield; Tsuey T. Wang, Summit, both of N.J.

[73] Assignee: AT&T Bell Laboratories, Murray Hill, N.J.

[21] Appl. No.: 466,771

[22] Filed: Feb. 14, 1983

[51] Int. Cl.³ .............................................. B29D 7/20
[52] U.S. Cl. ........................................ 264/22; 264/24; 264/27; 425/174.8 R; 425/174.8 E
[58] Field of Search ....................... 264/22, 24, 26, 27; 425/174.8 R, 174.8 E

[56] References Cited

U.S. PATENT DOCUMENTS

| | | | |
|---|---|---|---|
| 3,705,312 | 12/1972 | Sessler et al. | 29/594 |
| 3,943,614 | 3/1976 | Yoshikawa et al. | 264/22 |
| 4,308,223 | 12/1981 | Stern | 264/22 |
| 4,345,359 | 8/1982 | Micheron | 264/22 |
| 4,346,505 | 8/1982 | Lemonon et al. | 264/22 |

FOREIGN PATENT DOCUMENTS 2845255  4/1979  Fed. Rep. of Germany ........ 264/26

OTHER PUBLICATIONS

"Piezoelectricity in Polyvinylidenefluoride," *Journal of the Acoustical Society of America*, G. M. Sessler, 1981, pp. 1596–1608.
"Polarization of Poly(Vinylidene Fluoride) by Application of Breakdown Fields," *Journal of Applied Physics*, vol. 53(10), T. T. Wang et al., 1982, pp. 6552–6556.
Wang et al., 4-23, Serial No. 350031.

*Primary Examiner*—Jeffery Thurlow
*Attorney, Agent, or Firm*—James H. Fox

[57] ABSTRACT

Electrically polarizable material (e.g., PVDF film) is poled by applying an electric field across the film. In the inventive technique, insulation is provided on the surface of the film. In a typical embodiment, a compliant dielectric annulus insulates the polarized region from the edges of the film. This substantially eliminates breakdown at the edges of the film, allowing increased poling voltages. The technique can reduce poling time to typically a few seconds at room temperature, as compared to minutes or hours by prior art techniques, some of which required elevated temperatures.

16 Claims, 7 Drawing Figures

POLARIZING OF PIEZOELECTRIC MATERIAL

BACKGROUND OF THE INVENTION

1. Field of the Invention

This invention relates to a method of polarizing a material by applying an electric field thereto.

2. Description of the Prior Art

Poly(vinylidene fluoride) (PVDF) produces a piezoelectric and pyroelectric effect when polarized. This material, along with various copolymers, has been investigated for use in transducers, including microphones, headphones, loudspeakers, pressure sensors, touch-sensitive keyboards, intrusion detectors, etc. The PVDF material is most frequently formed into a film having a thickness in the range of about 6 to 150 μm. In order to polarize a PVDF film to obtain a substantial piezoelectric and pyroelectric response, an electric field is applied across the film. Typical prior art methods for polarizing PVDF include thermal poling and corona poling. In thermal poling, the sample is first metallized and subjected to a field of from about 500 to 800 kV/cm at a temperature of about 90° C. to 110° C. over a period of typically an hour. The film is then cooled to room temperature under the applied field. In the corona technique, a corona discharge is applied to the film, typically for a few minutes' time. A summary of these techniques is given in "Piezoelectricity in polyvinylidenefluoride," by G. M. Sessler, in *The Journal Of The Acoustical Society Of America*, Vol. 70(6), pages 1596-1608 (1981).

More recently, an improved polarizing technique has been described by T. T. Wang and J. E. West in "Polarization of poly(vinylidene fluoride) by Application of Breakdown Fields," *Journal Of Applied Physics*, Vol. 53(10), pages 6552-6556 (1982). In that technique, a dielectric plate is used to form a sandwich with the film, and voltage is applied to electrodes in contact with the dielectric plate and the PVDF film. This allows for polarizing to be accomplished at lower temperatures and for shorter times, with more uniform results than was typically obtained with prior art methods. However, this technique still requires typically on the order of 20 minutes to obtain a good piezoelectric response. It is especially desirable that polarizing be accomplished at room temperature (20° C.) to allow for convenient handling of the film in production, without the necessity for insertion into an oven, or contact with other heating devices. Furthermore, a reduction of the poling time is desirable, preferably to less than 1 minute.

SUMMARY OF THE INVENTION

We have invented an improved method of polarizing electrically polarizable material. In this technique, an electric field is applied across a portion of a sheet of the material, while a dielectric in contact with a surface of the sheet insulates the portion from at least one edge of the sheet. An increase in the breakdown voltage is thereby obtained. The dielectric can be in the form of an annulus surrounding the polarized portion. In one embodiment, the dielectric is a compliant material. A multiplicity of interior portions of the sheet can be separately polarized by means of dielectric insulation contacting a surface of the sheet between the interior portions of the sheet. Films comprising poly(vinylidene fluoride) are advantageously polarized by the present technique.

DETAILED DESCRIPTION

The following detailed description relates to an improved method of polarizing electrically polarizable material. Films of poly(vinylidene fluoride) have been successfully poled by this technique, which relates to our discovery that typical prior art poling techniques are substantially limited by flashover of electrical charge around the edges of the film. As used herein, the term "breakdown" means electrical arcing through the film, or along the surface of the film, from one electrode to another. The present technique substantially increases the resistance to arcing along the surface, so that the breakdown voltage is typically limited only by breakdown through the film itself.

Among several methods available for poling PVDF films, the room temperature poling technique for two-side-metallized films is particularly attractive for practical use because of the ease with which the films can be polarized uniformly over the electroded area. To achieve high values of piezoelectric activity in room temperature poling, electric fields in excess of 2 or 3 MV/cm must be applied to the film over a sufficient period of time. However, previous attempts to pole the film with high fields have encountered difficulty because of breakdowns which occur almost instantaneously at fields higher than 3.5 MV/cm. While in one prior art investigation placing the electroded film in a paraffin oil or in vacuum allows the film to be poled at a slightly higher field (ca. 4.2 MV/cm), the operation is too cumbersome for practical purposes. Moreover, even in paraffin oil or vacuum, the maximum poling field is still far below the dielectric strength of PVDF, which has been reported to be about 9 MV/cm when measured with the film immersed in a silicone oil.

We have found that the breakdown events near 3.5 MV/cm and greater are, in most cases, induced by flashover or arcing around the nonelectroded edge of the films. We have determined that in such cases, electrical charge flows from one electrode outward along the surface of the film to the edge, over the edge, and then back along the other surface to the other electrode. Thus, by blocking the nonelectroded boundary with suitable insulating solids, the film can be poled with substantially higher fields without incidence of breakdowns. This allows, for example, shorter poling times than obtained with prior art techniques. Alternately, for a given poling voltage, the present technique provides for a higher yield of usable films than prior art methods, wherein arcing typically reduced the yield.

Figure 1:
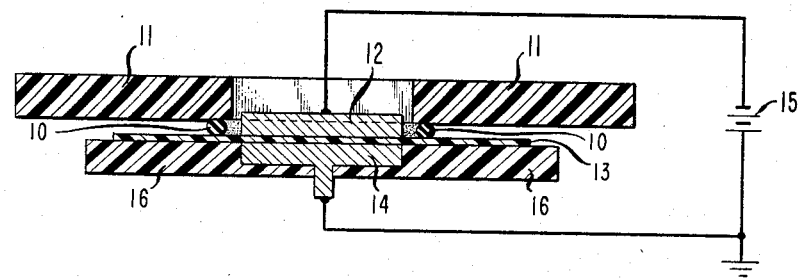
FIG. 1 shows a method of polarizing a film wherein electrodes contact both surfaces thereof.

Referring to FIG. 1, in the initial phase of this study, the PVDF sample (13) was poled immediately after its electroded area was positioned between two brass blocks (12, 14). The top brass block (12) had a weight of about 160 grams. The film edges were supported by a lower insulating plate (16) surrounding the lower brass block (14). However, no insulation (e.g., annulus 10 and top plate 11) was present on top of film 10. By poling in this manner, we were able to apply the voltage for a few minutes as long as the voltage was below 8 kV (3.2 MV/cm). (In a few cases where poling was interrupted by breakdowns, the failure was found to be always caused by local discharges through pinholes or minute defects in the metallized part of the film.) Above 8 kV, however, breakdown began to occur, mostly by edge flashovers rather than by local discharges through the film.

To eliminate the flashover, the present technique provides for a dielectric contacting a surface of the film between the polarized portion of the film and one or more edges of the film. This substantially eliminates breakdown from proceeding along the surface of the film. The dielectric is typically a compliant material, which can obtain a good seal to the film. The weight of a second dielectric, or other means, can be used as required to press the compliant dielectric onto the film. The breakdown path from one electrode to another is thereby substantially extended, reducing or eliminating the incidence of flashover around the edge of the film.

For example, an O-ring (10) and a PMMA, poly(-methyl methacrylate), plate (11) were added to the poling setup shown in FIG. 1. The PMMA plate ($1.2 \times 30 \times 30$ cm$^3$) had a 6.5 cm circular opening, which allowed the plate to clear the upper brass block (12) and rest directly on the O-ring to form a tight seal around the electroded area of the PVDF film (13). The PMMA plate had a weight of approximately 1 kg. The pressure of this plate on the compliant O-ring helped form a good seal between the O-ring and the film. This technique completely eliminated flashovers and permitted the samples to be poled with fields up to 9 MV/cm for at least 5 seconds without incidence of destructive discharges. The piezoelectric data shown in FIG. 2 and 3 was obtained from samples poled with this technique.

To ascertain that the sample is subjected to the applied field over the specified length of time, the rise time for the poling circuit was determined by substituting the PVDF film with a standard capacitor having the same capacitance ($1.1 \times 10^{-8}$ F.) It was found from measurements of charging current that the voltage across the capacitor reached the externally applied voltage (up to 20 kV) in less than 0.1 second, which is much shorter than the smallest poling time of 1 second used herein.

The above principles will be more fully explained by means of the following Examples:

EXAMPLE 1

The biaxially oriented PVDF films used herein are 25 μm thick capacitor grade films obtained from Kureha Chemical Company. The films contained about equal fractions of Form I ($\beta$) and Form II ($\alpha$) crystals when determined by X-ray analysis. Pieces, each $15 \times 15$ cm$^2$ in size, were cut from a large roll of film and cleaned thoroughly with trichloroethane. Circular aluminum electrodes, about 100 nm thick and 6 cm in diameter, were vapor-deposited in the center of opposite faces of each film piece, leaving an unmetallized border. Poling was carried out using the setup of FIG. 1, which comprised a pair of brass blocks (12, 14) connected to a dc power source (15), a silicon rubber O-ring (10) (10.3 cm I.D. and 11.1 cm O.D.), and two plates (11, 16) made of PMMA. The brass blocks (12, 14) had a diameter of 6 cm, and the metallized portion of the film was placed between the brass blocks. The lower PMMA plate ($1.2 \times 16 \times 16$ cm$^3$) had a 6 cm circular opening, which was tight-fitted to the lower brass block to provide a support for the PVDF sample.

After poling, the samples were stored in a short-circuit condition at room temperature for more than 72 hours, then cut into rectangular pieces with a size of $0.45 \times 5.3$ cm$^2$ for measurements of their piezoelectric activity. Piezoelectric measurements were performed by applying a sinusoidal strain with a frequency of 110 Hz and an amplitude of 0.036%. In accordance with the common practice, the coordinates for determining the piezoelectric coefficients were chosen with the "3" axis along the surface normal of the film and the "1" axis along the longitudinal direction of the as-received roll of film.

Figure 2:
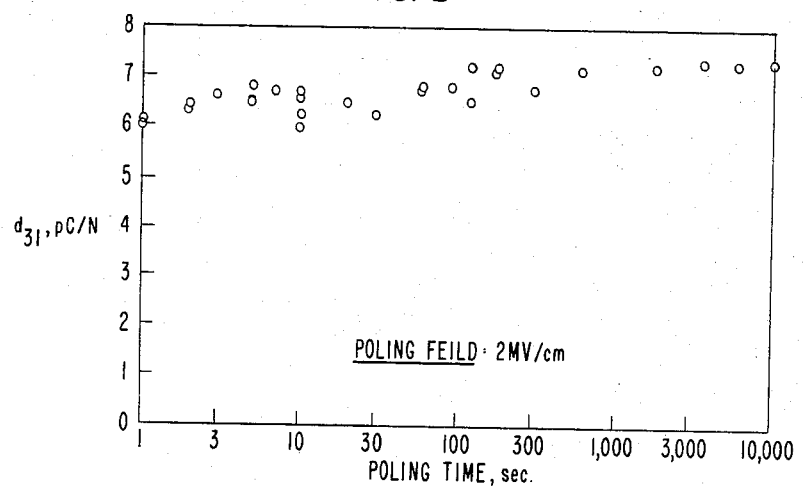
FIG. 2 shows the piezoelectric strain coefficient of PVDF as a function of poling time.

FIG. 2 is a plot of apparent piezoelectric strain coefficient, $d_{31}$ (the piezoelectric strain coefficient) as a function of poling time, $t_p$, for samples poled under a field of 2 MV/cm. (The piezoelectric stress coefficient, $e_{31}$, is given by $e_{31} = d_{31} E_{11}$, where $E_{11}$ is the Young's modulus for the material polarized.) All data was obtained from neat samples which did not suffer from breakdown during the specified lengths of poling time. These results show a relatively fast initial rise of $d_{31}$ with the poling time; e.g., at 1 second, the $d_{31}$ value has already risen to more than 80% of the corresponding value at $10^4$ seconds. The data indicates a slow but noticeable increase of piezoelectric activity for poling times larger than 1 second. This increasing trend continues for a few hours until the polarization process is interrupted by breakdown in the film.

Data of $d_{31}$ obtained at higher poling fields also showed the same $t_p$ dependence as depicted in FIG. 2; however, while the $d_{31}$ curve rose higher with increasing field strength, most of the rise occurred in the first second, while the increase of $d_{31}$ in the later stage of poling became progressively smaller as the field was increased. Since extending the poling time increases the probability of breakdown, there is a clear advantage of obtaining high piezoelectric activity by poling the film at higher fields for a short time interval than at lower fields over a long period of time.

Figure 3:
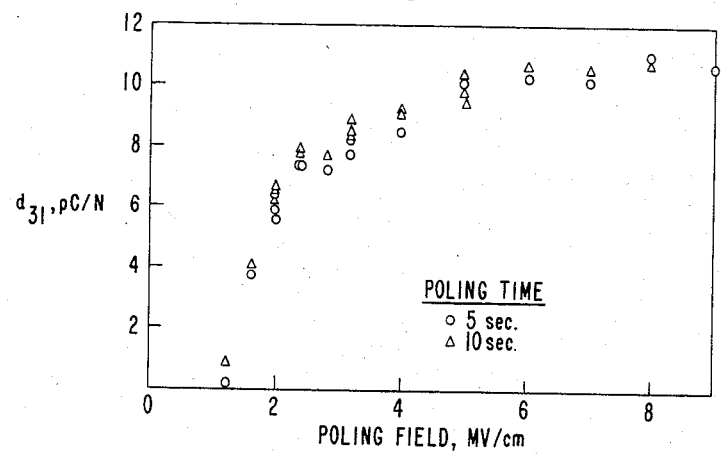
FIG. 3 shows the piezoelectric strain coefficient of PVDF as a function of poling field.

To see the effect of applied field on the piezoelectric activity, samples were poled for periods of 5 and 10 seconds, respectively, at various electric fields up to the field strength where the samples could no longer sustain the applied voltages over the specified lengths of time. The $d_{31}$ data for the poled films (after 72 hours of short-circuit conditioning) is shown in FIG. 3. While there is a slight difference in $d_{31}$ value between the two poling times, the difference becomes diminishingly smaller with increasing field. Moreover, the $d_{31}$ curves for both poling times tend to level off at about 6 MV/cm after rising sharply at fields between 1 and 2.5 MV/cm. The $d_{31}$ value at 2 MV/cm for $t_p = 5$ seconds is about 6 pC/N, which is about 40% lower than the saturation value of 10 pC/N.

EXAMPLE 2

In this Example, a uniaxially oriented PVDF film approximately 25 μm thick was polarized using the technique as illustrated in FIG. 1. The film was formed by extrusion from resin (Solef and Cie resin X8N) into a $3 \times 3$ inch ($7.5 \times 7.5$ cm$^2$) sheet. The sheet had an initial thickness of 100 μm. It was stretched in one direction at 70° C. to 4 times its original length, and annealed in the stretched state for 2 hours at 120° C. Aluminum electrodes 100 nm thick were deposited on both sides over a 6 cm diameter circular area. Polarizing was accomplished as above at 2 MV/cm for 1 minute. A value of $d_{31}=25.7$ pC/N ($e_{31}=69$ mC/m$^2$) was achieved.

EXAMPLE 3

In this Example, an unoriented (unstretched) film was formed by extrusion from resin, as in Example 2. The thickness was 32 μm, and aluminum electrodes were applied as before. The film was polarized as above at 1.6 MV/cm for 30 seconds. A value of $d_{31}=5$ pC/N ($e_{31}=8.8$ mC/m$^2$) was achieved.

EXAMPLE 4

Figure 4:
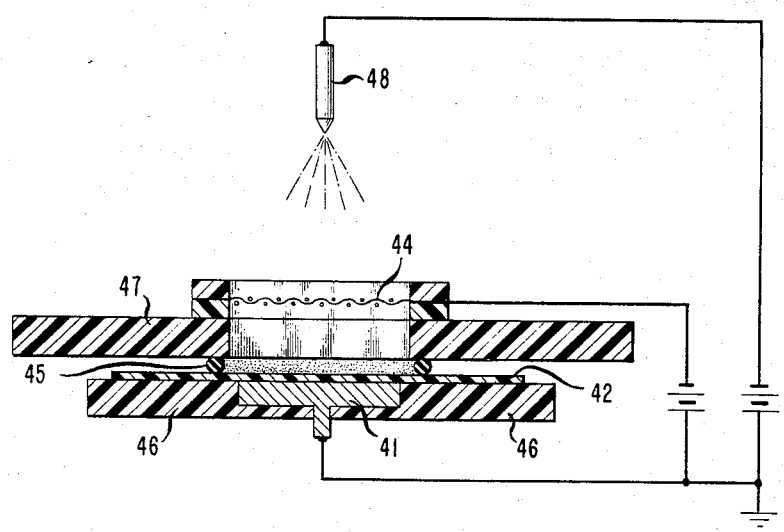
FIG. 4 shows a corona discharge poling technique wherein an electrode contacts one surface thereof.

In this Example, corona poling of a PVDF film is accomplished using the inventive technique. Referring to FIG. 4, the brass block 41 was at ground potential, with a PVDF film 42 placed thereon. The PVDF film was the same type as in Example 1 above. However, only the side in contact with brass block 41 (bottom side as viewed) was electroded, with 100 nm of aluminum having a diameter of 6 cm. The top surface of the film was left bare. The lower brass block (41) was fitted into a PMMA plate (46) as before. The inventive O-ring insulator 45 and insulating plate 47 were positioned on the film, as before. A corona needle (48) was located 4 cm above the film, and a voltage of −26 kV applied thereto. Metal grid 44, a circular stainless steel wire mesh, was placed 1.2 cm above the film, and a voltage of −9.9 kV was applied thereto. Poling was accomplished for 10 minutes under these conditions. The value of $d_{31}$ achieved was 9.7 pC/N; $e_{31}$ was 27 mC/m$^2$ Without the O-ring 45 and plate 47, poling was frequently accompanied by flashover at the edge of film 42, significantly reducing yield as compared to the inventive technique.

In summary, with the inventive poling technique, it is possible to pole PVDF film with fields up to at least 9 MV/cm. This is significantly in excess of the prior art techniques, and is limited typically only by the breakdown field in the film itself. The ease with which the film can be poled to a high level of piezoelectric activity, in air and at room temperature, makes this technique particularly attractive from a practical point of view. In the present technique, a poling field in excess of 3 MV/cm is typically used. It appears that 6 MV/cm is the optimum field for poling the biaxially oriented (Form I+Form II) films. While the dielectric in contact with the sheet typically forms an annulus around the interior portion, this is not always necessary. For example, when polarizing a portion that is asymmetrically located with respect to the edges of the sheet, the dielectric may need to be located only between that portion and the nearest edge to prevent flashover.

Figure 5:
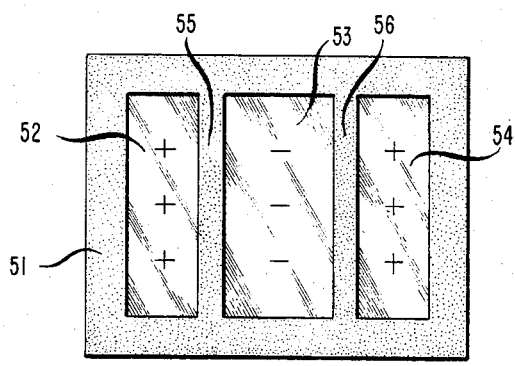
FIG. 5 shows an article having adjacent regions of opposite polarization produced by the present technique.

While the inventive technique substantially reduces flashover at the edge of a film, it also can be used in obtaining spaced interior polarized regions. These spaced regions, which can be defined by spaced metal electrodes on one or both surfaces of the film, can be of the same, or opposite, polarization. Referring to FIG. 5, a film is shown having an insulating annulus 51 impressed thereon. Interior regions 52, 53, and 54 have alternating polarization. To obtain this, the regions to be polarized (52, 53, 54) are metallized, with the spacing between the polarized regions (55, 56) being left unmetallized. Thus, when insulating material is pressed onto the surface in regions 51, 55, and 56, polarizing can be accomplished while substantially eliminating flashover around the edge, or between the regions. It is apparent that complex polarization geometries can thus be achieved with the present technique. These are useful, for example, in obtaining directional microphones, push-pull microphones or headphones, etc., wherein a multiplicity of piezoelectrically active regions having separate electrodes attached thereto is desired.

As noted, the present technique obtains a good seal between the dielectric and the film, with substantially no gaps therebetween, to prevent flashover from proceeding by means of surface conduction along the film from the electrodes to the edge. To further examine the requirements for making a good seal with the dielectric, the O-ring as shown in FIG. 1 was placed on an electroded PVDF film as above, but without the PMMA dielectric plate (11) thereon. It was found that flashover occurred substantially as noted above in the initial investigation without the O-ring. Next, a PMMA plate having an inner diameter of about 9.5 cm, an outer diameter of about 11.5 cm, a thickness of about 12 mm, and weighing about 80 grams was placed on the O-ring (thus replacing plate 11 in FIG. 1). The weight of this smaller PMMA plate was sufficient to prevent flashover up to the maximum field tested, 9 MV/cm. Finally, this PMMA plate was removed, and a brass ring of similar inner and outer diameter as the aforementioned small PMMA plate, and weighing about 100 grams, was placed on the O-ring in the configuration of FIG. 1. It was found that flashover occurred at poling voltages of interest. Hence, it is apparent that only dielectric material should be used in the immediate vicinity of the compliant dielectric if additional pressure is desired. It is also apparent that rather than relying on the weight of a dielectric plate (11 in FIG. 1) on the insulating dielectric (10 in FIG. 1), a force can be applied by a variety of means, as long as conducting material is avoided to the extent necessary to obtain an increased breakdown voltage.

Figure 6:
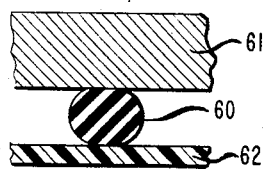
FIG. 6 and 7 show cross sections of typical compliant dielectric materials.
Figure 7:
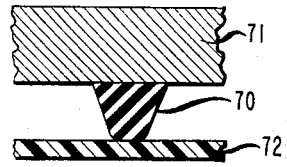

While an O-ring of silicone material has been found very suitable for use as a dielectric annulus, other materials and shapes are possible. As noted in FIG. 6, upon compression, the O-ring 60, as pressed by dielectric plate 61, makes a good seal to the surface of the film 62 because of the relatively high pressure exerted at the narrow edge of the O-ring, causing it to flatten. Referring to FIG. 7, a wedge-shaped geometry 70 can also be used to obtain a good seal. Still other geometries are possible, wherein a sufficient pressure is obtained on the compliant dielectric to obtain a good seal. In fact, with a sufficiently thick sheet of polarizable material, it is apparent that the compliance of the polarized material itself can be used to obtain a good seal. In that case, the dielectric contacting the sheet need not be compliant material. As used herein, the term "compliant" means having a shear modulus in the range of from $10^5$ to $10^8$ N/m$^2$. Furthermore, while a separate compliant dielectric annulus and dielectric plate are shown in FIG. 1 and 4, it is apparent that they can be a single piece. Thus, the annulus 51 in FIG. 5 can be a single compliant member having a ridge on the side that contacts the polarized sheet.

While the polarizing of PVDF is advantageously accomplished according to the present technique, it is apparent that other polarizable material can similarly benefit from the present invention. For example, copolymers of PVDF, and a copolymer of vinylidene cyanide and vinyl acetate, are polarizable materials that are also being investigated for numerous transducers and other applications. The term "polarizable material" as used herein means any material that obtains an increased piezoelectric or pyroelectric response upon the application of an electric field.

The metal electrodes are desirably deposited on one or both sides of the film, as necessary, prior to poling. This helps maintain piezoelectric activity that can otherwise be reduced if the film is heated after poling, as can happen in typical metal deposition processes. However, the present invention is effective whether or not the polarized region is metallized prior to poling. While relatively thin sheets of polarizable material, also referred to as "films" herein, have been noted above, sheets of PVDF material having thicknesses of several millimeters are also used, typically in hydrophones. The present technique can advantageously be used to polarize such sheets also. The term "sheet," as used herein, thus includes a material having two broad surfaces of whatever thickness and geometry, and includes sheets that are corrugated, bent in an arc, or otherwise shaped in three dimensions.

While the insulating dielectric is typically removed from the sheet after poling, it can alternately form a permanent part (for example, a support ring) of a resulting transducer employing the polarized material. It is also apparent that the insulating dielectric can obtain a good seal with the polarizable sheet by cementing, welding, or other techniques that do not rely on maintaining pressure between the insulating dielectric and the sheet. However, the pressure seal is convenient when the insulating dielectric is to be removed after poling. While the compliant dielectric shown has been pressed onto one side of a sheet having a noncompliant dielectric under the other side at the contact point, it is apparent that the dielectric on both sides of the sheet can be compliant material. It is apparent that the dielectric contacting either surface serves to reduce the possibility of flashover, and hence increases the breakdown voltage.

All such applications of the inventive teaching are within the spirit and scope of the present invention.

What is claimed is:

1. A method of polarizing a sheet of polarizable material by steps comprising applying an electric field across a portion of said sheet characterized in that
at least during said polarizing, at least one edge of said sheet is insulated from said portion by steps comprising pressing a compliant dielectric onto said sheet between said portion and said edge, whereby the voltage that can be applied to said sheet without breakdown is substantially increased.

2. The method of claim 1 wherein said dielectric is an annulus that surrounds said portion.

3. The method of claim 1 wherein said polarizable material is poly(vinylidene fluoride) or a copolymer thereof.

4. The method of claim 3 wherein said poly(vinylidene fluoride) or copolymer thereof is in the form of a film having a thickness in the range of 6 to 150 micrometers.

5. The method of claim 4 wherein said polarizing is accomplished with an electric field greater than 3,000,000 volts/cm.

6. The method of claim 4 wherein said polarizing is accomplished with an electric field greater than 4,000,000 volts/cm.

7. The method of claim 4 wherein said polarizing is accomplished with an electric field greater than 5,000,000 volts/cm.

8. The method of claim 1 wherein said sheet of polarizable material is a biaxially oriented film of poly(vinylidene fluoride) wherein the value of the piezoelectric strain coefficient ($d_{31}$) achieved by said polarizing is at least 5 pC/N.

9. The method of claim 1 wherein said sheet of polarizable material is a uniaxially oriented film of poly(vinylidene fluoride) wherein the value of the piezoelectric strain coefficient ($d_{31}$) achieved by said polarizing is at least 25 pC/N.

10. The method of claim 1 wherein said sheet of polarizable material is a film of poly(vinylidene fluoride), and said poling is accomplished for a time less than 10 seconds.

11. The method of claim 10 wherein said poling is accomplished at room temperature.

12. The method of claim 1 wherein a multiplicity of interior portions of said sheet are insulated from each other by dielectric material contacting a surface of said sheet between said portions during said polarizing.

13. The method of claim 1 wherein said portion of said material has at least one surface metallized prior to said applying an electric field.

14. The method of claim 1 wherein said portion of said material has both surfaces metallized prior to said applying an electric field.

15. The method of claim 1 wherein said dielectric is removed from said sheet after said polarizing.

16. The method of claim 1 wherein said dielectric is not removed from said sheet after said polarizing.

* * * * *